United States Patent [19]

Marcantonio

[11] Patent Number: 5,562,243
[45] Date of Patent: Oct. 8, 1996

[54] METHOD AN APPARATUS FOR OBTAINING REFLOW OVEN SETTINGS FOR SOLDERING A PCB

[75] Inventor: Angelo R. Marcantonio, Princeton, N.J.

[73] Assignee: Siemens Corporate Research, Inc., Princeton, N.J.

[21] Appl. No.: 336,453

[22] Filed: Nov. 9, 1994

Related U.S. Application Data

[62] Division of Ser. No. 40,809, Mar. 31, 1993, Pat. No. 5,439,160.

[51] Int. Cl.$^6$ ........................................... B23K 3/00
[52] U.S. Cl. ........................ 228/8; 228/9; 364/477.05
[58] Field of Search ................ 228/7–9, 42, 56.5; 364/150, 477, 557; 395/21, 23, 25

[56] References Cited

U.S. PATENT DOCUMENTS

| | | | |
|---|---|---|---|
| 5,036,479 | 7/1991 | Prednis et al. | 364/580 |
| 5,060,276 | 10/1991 | Morris et al. | 382/8 |
| 5,389,764 | 2/1995 | Nishii et al. | 219/506 |

*Primary Examiner*—Samuel M. Heinrich
*Attorney, Agent, or Firm*—Adel A. Ahmed

[57] ABSTRACT

An artificial neural network is trained to recognize inputted thermal and physical features of a printed circuit board, for providing settings for a reflow oven for obtaining acceptable soldering of the printed circuit board.

6 Claims, 8 Drawing Sheets

SUGGESTED TEST OVEN SETUP

CONVEYOR SPEED: 75 cm/min
ZONE #01 WATTS: 950
ZONE #02 WATTS: 950
ZONE #03 WATTS: 500
ZONE #04 WATTS: 500
ZONE #05 WATTS: 650
ZONE #06 WATTS: 650
ZONE #07 WATTS: 1000
ZONE #08 WATTS: 1000

FIG. 8   IR-REFLOW OVEN FEATURE LIST ENTRIES

| | | |
|---|---|---|
| In#1 | Wgt (gr) | WEIGHT OF PCB IN GRAMS |
| In#2 | Thick (mm) | THICKNESS OF PCB IN MILLIMETERS |
| In#3 | Along Size-cm | SIZE OF PCB ALONG OVEN BELT TRAVEL DIRECTION IN CENTIMETERS |
| In#4 | Across Size-cm | SIZE OF PCB ACROSS OVEN BELT TRAVEL IN CENTIMETERS |
| In#5 | Thin-IC Area-mm$^2$ | TOTAL SURFACE AREA OF THIN IC'S IN SQUARE MILLIMETERS |
| In#6 | Thick-IC Area-mm$^2$ | TOTAL SURFACE AREA OF THICK IC'S IN SQUARE MILLIMETERS |
| In#7-#10 | PCB Mask | PCB FINISH GLOSS - VERY HIGH=4, HIGH=3, MEDIUM=2, LOW=1 |
| In#11 | PCB Layers | TOTAL NUMBER OF PCB LAYERS |
| In#12-#15 | PCB Color | PCB FINISH COLOR - VERY LIGHT=4, LIGHT=3, MEDIUM=2, DARK=1 |
| In#16 | Avg #1 | TEST OVEN MOLE AVERAGE OF 5 THERMOCOUPLE TEMP'S AT X=80 SECS |
| In#17 | Avg #2 | TEST OVEN MOLE AVERAGE OF 5 THERMOCOUPLE TEMP'S AT X=161 SECS |
| In#18 | Avg #3 | TEST OVEN MOLE AVERAGE OF 5 THERMOCOUPLE TEMP'S AT X=241 SECS |
| In#19 | Avg #4 | TEST OVEN MOLE AVERAGE OF 5 THERMOCOUPLE TEMP'S AT X=322 SECS |
| In#20 | Avg Max | TEST OVEN MOLE AVERAGE OF 5 THERMOCOUPLE MAXIMUM TEMP'S |
| In#21 | Avg Mpt | TEST OVEN MOLE AVERAGE OF 5 TIMES TO REACH MAXIMUM TEMP'S |
| In#22 | Avg Rt | TEST OVEN MOLE - AVERAGE RATE OF CHANGE TO MAX (AVG MAX/AVG MPT) |
| In#23 | Avg Tm | TEST OVEN MOLE - TIME FOR 5 THERMOCOUPLES TO REACH 300 DEGREES F. |
| Out#1 | Zn #01 | IR-OVEN WATTAGE SETTING IN ZONE #1 FOR THIS PCB |
| Out#2 | Zn #02 | IR-OVEN WATTAGE SETTING IN ZONE #2 FOR THIS PCB |
| Out#3 | Zn #03 | IR-OVEN WATTAGE SETTING IN ZONE #3 FOR THIS PCB |
| Out#4 | Zn #04 | IR-OVEN WATTAGE SETTING IN ZONE #4 FOR THIS PCB |
| Out#5 | Zn #05 | IR-OVEN WATTAGE SETTING IN ZONE #5 FOR THIS PCB |
| Out#6 | Zn #06 | IR-OVEN WATTAGE SETTING IN ZONE #6 FOR THIS PCB |
| Out#7 | Zn #07 | IR-OVEN WATTAGE SETTING IN ZONE #7 FOR THIS PCB |
| Out#8 | Zn #08 | IR-OVEN WATTAGE SETTING IN ZONE #8 FOR THIS PCB |
| Out#9 | Zn #09 | IR-OVEN WATTAGE SETTING IN ZONE #9 FOR THIS PCB |
| Out#10 | Zn #10 | IR-OVEN WATTAGE SETTING IN ZONE #10 FOR THIS PCB |
| Out#11 | Belt Speed | |

FIG. 9

SAMPLE PCB IR-REFLOW OVEN FEATURE LIST

| | | |
|---|---|---|
| In#1 | Wgt (gr) | 255 |
| In#2 | Thick (mm) | 1.65 |
| In#3 | Along Size-cm | 29.2 |
| In#4 | Across Size-cm | 23.2 |
| In#5 | Thin-IC Area-mm$^2$ | 2170 |
| In#6 | Thick-IC Area-mm$^2$ | 1152 |
| In#7-#10 | PCB Mask | 1-0-0-0 = 4 |
| In#11 | PCB Layers | 4 |
| In#12-#15 | PCB Color | 0-0-0-1 = 1 |
| In#16 | Avg temp #1 | 217 F |
| In#17 | Avg temp #2 | 335 F |
| In#18 | Avg temp #3 | 135 F |
| In#19 | Avg temp #4 | 96 F |
| In#20 | Avg Max temp | 372 F |
| In#21 | Avg Mpt | 189 SECONDS |
| In#22 | Avg Rt | 1.97 DEGREES F/SECOND |
| In#23 | Avg Tm | 121 SECONDS |
| Out#1 | Zn #01 watts | 1100 |
| Out#2 | Zn #02 watts | 1100 |
| Out#3 | Zn #03 watts | 600 |
| Out#4 | Zn #04 watts | 600 |
| Out#5 | Zn #05 watts | 800 |
| Out#6 | Zn #06 watts | 800 |
| Out#7 | Zn #07 watts | 1150 |
| Out#8 | Zn #08 watts | 1150 |
| Out#9 | Zn #09 watts | 670 |
| Out#10 | Zn #10 watts | 670 |
| Out#11 | Belt Speed | 75 CM/MIN |

METHOD AN APPARATUS FOR OBTAINING REFLOW OVEN SETTINGS FOR SOLDERING A PCB

TECHNICAL FIELD OF THE INVENTION

This is a divisional of application Ser. No. 08/040,809 filed Mar. 31, 1993, now U.S. Pat. No. 5,439,160.

The field of the present invention relates generally to flow soldering of printed circuit boards (PCB), and more particularly relates to the determination of settings of infrared (IR) reflow oven temperature profiles for obtaining acceptable soldering of given configurations of PCB's.

BACKGROUND OF THE INVENTION

Modern electronic circuits require the use of printed circuit boards for mounting and interconnecting electronic devices thereon. Typically, the various components mounted on a printed circuit board (PCB) are soldered to the board. One typical technique to solder components to a PCB consists of placing the PCB on a conveyor, and moving the PCB across a standing wave of molten solder. In recent years, for obtaining more precise control of the soldering process, infrared (IR) reflow ovens have been developed for providing a plurality of temperature zones through which a PCB passes, for causing the reflow or remelting of solder placed on the PCB prior to running it through the oven, for soldering components to the PCB. These ovens provide for closely controlled preheating of the PCB's, followed by sufficient heating in a reflow zone to cause solder on the board to reflow for soldering components, followed by a cycle of natural cool-down.

To accomplish the precise control required, for obtaining high quality soldering of components to a PCB, without delaminating the PCB material, or damaging electronic components on the board through overheating or heat stress cycling, it is important to adjust the temperature profile of the reflow oven to match the temperature profile required for the particular PCB to be soldered. To accomplish this, a large number of printed circuit boards of the same type are passed through the oven under different heating conditions, to determine the best setting of the oven for obtaining optimum soldering of the PCB. Each time a different PCB, or differently configured PCB is to be soldered, a relatively large number of identically configured PCB's must be run through the oven to obtain the optimum oven settings for soldering that configuration of PCB. Thereafter, a production run is made for soldering a large number of the identical PCB's.

During the process of obtaining the best oven settings for a particular PCB configuration, a significant number of test boards are typically scrapped. To overcome this problem, and to eliminate the time expended in test soldering PCB's, various techniques have been developed in the prior art to reduce the number of PCB's required for obtaining the best temperature profile for the setting of an oven to typically reflow solder the PCB configuration. For example, devices sometimes known as "moles", have been developed for mounting upon a PCB, to monitor various thermocouples strategically placed on the PCB, for remotely transmitting the temperature data back to a remotely located receiver, for obtaining the temperature profile of a PCB as it is passed through a reflow oven. One such temperature profile measuring system is for a flow solder system as shown and described in O'Rourke et al., U.S. Pat. No. 4,180,199.

Also, an effort has been made in the prior art to develop systems for automatically setting the controls for a reflow oven, for example, for controlling the temperature of various zones in the oven and the conveyor speed through the oven, in reflow soldering a PCB. One example of such a system is taught in Matsuo et al., U.S. Pat. No. 5,003,160. This system includes a data table for storing sets of control data relating to conveyor speed, and operating temperatures of individual heaters in specific zones of the associated oven. A microprocessor is programmed to receive conditional parameters associated with an object to be soldered, and respond by obtaining from the data table a set of control data closely associated with the combination of conditional parameters of the object. Features of the PCB, such as thickness thereof, surface area thereof, surface area of the largest component, type of material used, and the melting point of solder, are provided as input data for a PCB to be soldered, to permit the microprocessor to obtain control data from the data table for setting up the reflow oven. As indicated in column 4, lines 27 through 35 of U.S. Pat. No. 5,003,160, data stored in the data table is correlated between control data and conditional parameters associated with a plurality of objects to be soldered, respectively, for permitting the system to recognize the combination of conditional parameters associated with a given object to obtain the appropriate control data from the data table. This data is used to set up the associated reflow oven.

The present inventor recognized that there is a need in the field of the present technology for obtaining more rapid identification of control parameters for setting up an oven, such as a reflow oven, for optimizing the reflow soldering of various PCB's, without requiring the use of a very large memory for establishing a data table storing a combination of control parameters for each one of a relatively large population of different PCB boards. He also recognized the need to optimize the oven settings obtained for a specific PCB configuration, rather than use settings previously established for a PCB that has the closest match to the PCB to be soldered.

SUMMARY OF THE INVENTION

With the problems of the prior art in mind, it is an object of the invention to provide an improved method and apparatus for the control of IR reflow ovens in soldering a plurality of different PCB configurations.

Another object of the invention is to provide a method and apparatus for training an artificial neural network to respond to input features associated with a particular PCB configuration, for automatically determining the IR oven profile for controlling an IR oven to reflow solder a new PCB.

These and other objects of the invention are carried out by programming a microprocessor with an artificial neural network, or by using a dedicated neural network incorporated in an integrated circuit chip, and thereafter training the network using known zone temperatures from existing IR reflow oven profiles for test printed circuit boards previously run through the IR oven. Once the neural network is trained, it is used for obtaining the IR oven profiles for a new PCB. The new PCB is run through a test oven to obtain required reference temperatures. The reference temperatures together with a number of physical parameters provide identifying features for inputting to the trained neural network in a recall mode, for obtaining as outputs from the neural network the IR oven settings for obtaining high quality reflow soldering of the new board.

BRIEF DESCRIPTION OF THE DRAWINGS

Various embodiments of the method and apparatus of the present invention are described below with reference to the following drawings, in which like items are identified by the same reference designation, wherein:

FIG. 8 shows a listing of features for application to an artificial neural network in one embodiment of the invention.

FIG. 9 shows a feature listing of actual values for a typical PCB relative to the features as listed in FIG. 8.

DETAILED DESCRIPTION

In general terms, the present method and apparatus of the invention do not require a model of a PCB to be soldered for obtaining the IR oven zone settings for setting up the associated oven for soldering the board. The present invention provides for consideration of various physical and thermal properties of the PCB, as will be shown below, for permitting one to quickly and easily obtain the required IR oven zone settings for optimally soldering the PCB of interest.

Figure 1:
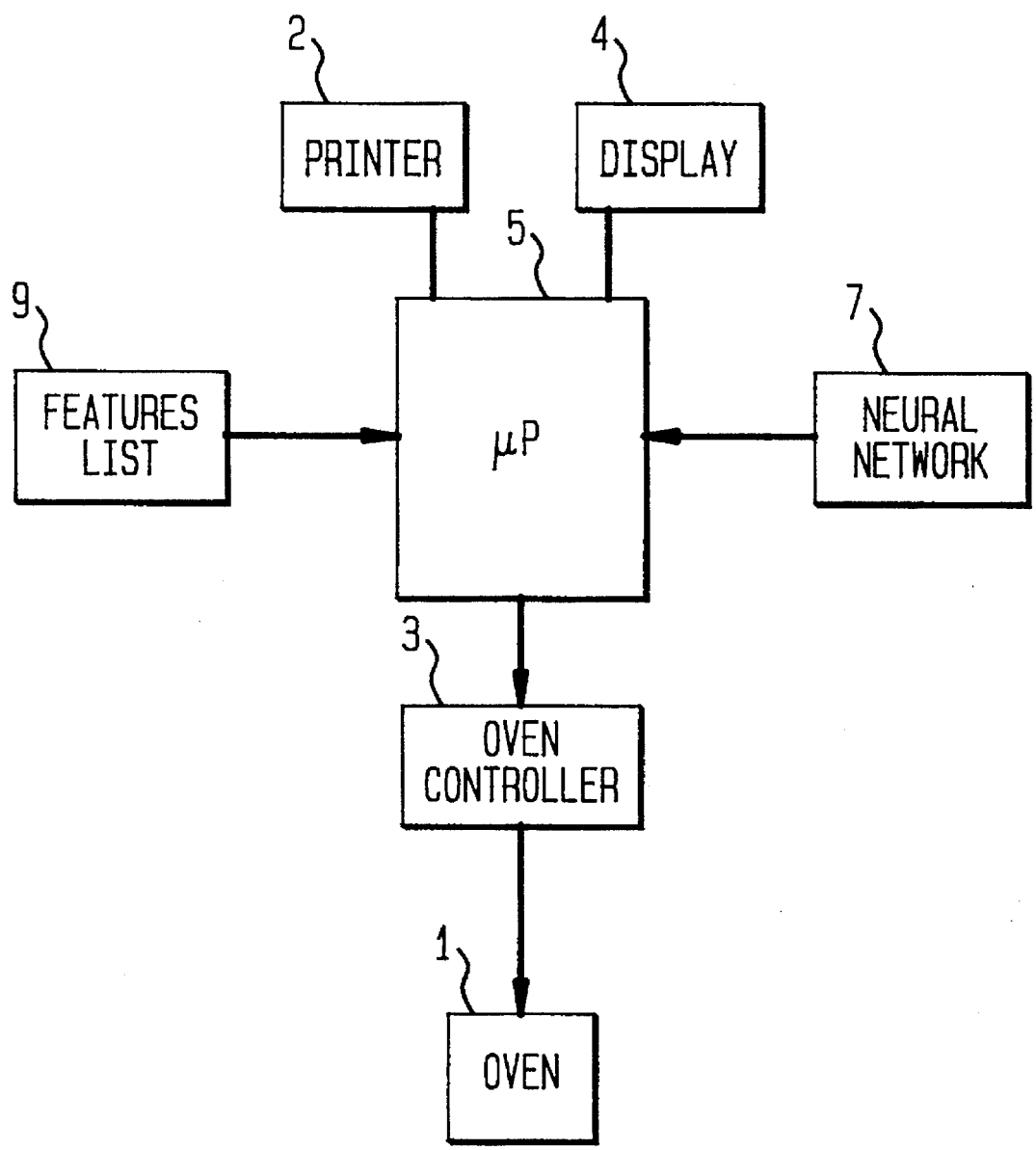
FIG. 1 is a simplified block diagram of the apparatus for one embodiment of the present invention.
Figure 2:
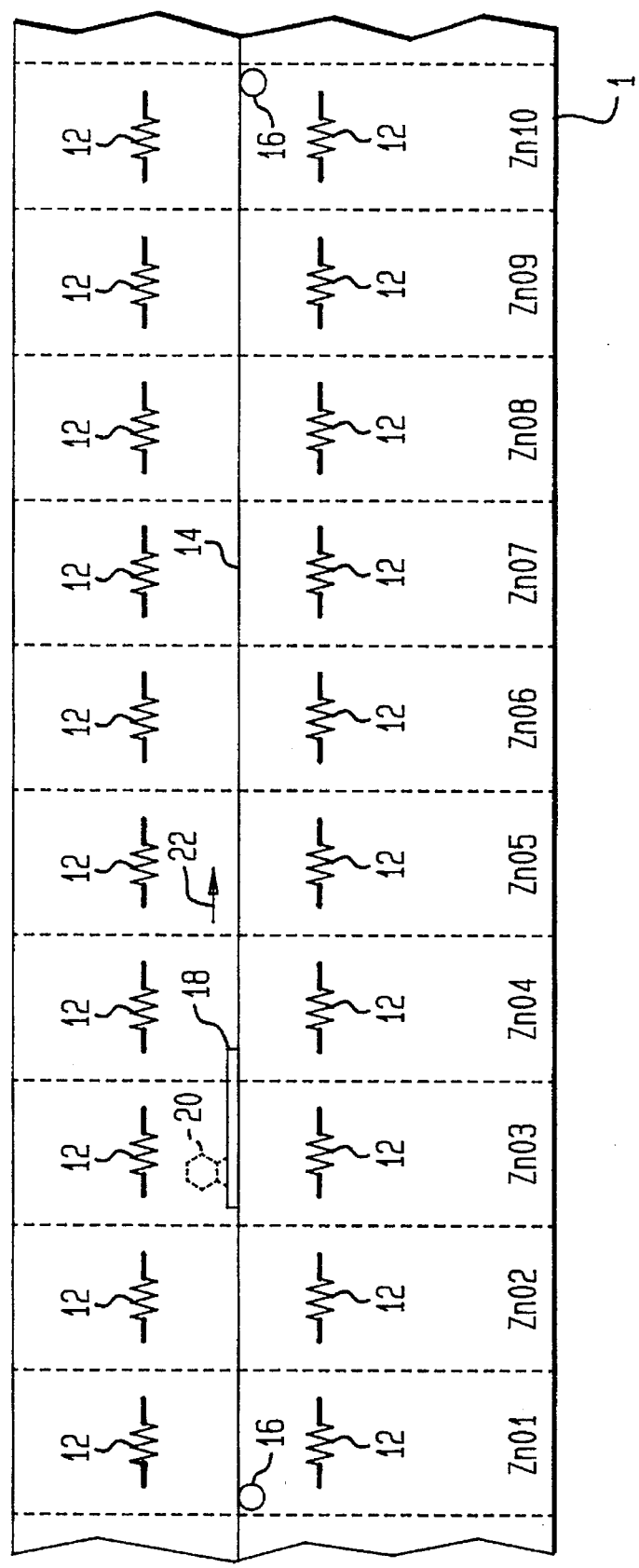
FIG. 2 is a simplified interior view of an example of a reflow oven associated with various embodiments of the invention.

More specifically, with reference to FIGS. 1 and 2, for a representative sample of boards 18, it is required that the IR oven 1 temperature profiles for these boards 18 be obtained. This is accomplished by obtaining a sufficient number of each one of sample board 18 configurations, and running them through the associated IR reflow oven 1 under different conditions, such as using different combinations of zone temperatures and conveyor belt 14 speeds, for selecting the best IR oven 1 temperature profile for reflow soldering that particular board 18 configuration,.

The next step is to configure the associated IR oven 1 with a predetermined set of zones Zn01–Zn10 (see FIG. 2), establish temperatures for selected zones (in this example zones Zn01–Zn08, see FIG. 6), and the speed of conveyor belt 14. Next, each one of the sample boards 18 are individually equipped with a temperature measurement device 20, and run through the oven 1, for obtaining input features associated with each individual PCB 18, respectively. These temperature parameters are obtained by noting the temperature of the sensors or thermocouples 24 (see FIG. 4) on the PC board 18 being run through the oven 1 at several intervals during conveyance thereof through the oven 1. Identical measurement intervals are used for each of the representative samples of PCB's 18. As will be described in greater detail below, these reference temperatures are used along with physical data associated with the respective PCB's 18, such as the dimensions thereof, number of integrated circuits (IC's), and so forth, to provide input features for training an artificial neural network 7. In this example, the neural network is programmed into a microprocessor 5, such as a personal computer.

After the artificial neural network 7 is trained, it is relatively easy to thereafter determine the IR oven profile for a new printed circuit board 18, by first running the PCB 18 through the IR reflow oven setup with the predetermined test zone temperatures and belt speed, for obtaining from the test oven configuration the reference temperatures associated witch the new PCB 18. These reference temperatures together with the physical parameters of the new PCB 18, relative to the representative sample of printed circuit boards 18 used to train the neural network 7, are applied to the latter in the recall mode, for obtaining the IR reflow oven 1 zone settings for reflow soldering the new PCB configuration. A more detailed description of the invention now follows below.

Apparatus for carrying out the method of the present invention is shown in FIG. 1, as an example not meant to be limiting. More specifically, this apparatus includes an IR reflow oven 1, a printer 2, an oven controller 3, a display 4, a microprocessor 5, an artificial neural network simulator 7, the latter being loaded into microprocessor 5, and an identified features list 9 for providing inputs to the artificial neural network 7 via microprocessor 5. In this example, the microprocessor 5 is an IBM PC/AT compatible computer, including a DELL® 325 personal computer, an AT386 central processing unit, and an 80387 math co-processor. Also, the neural network 7 simulation package used in this example is sold by NeuralWare, Inc., as "Neural Computing", NeuralWorks Professional II/PLUS, Version 4.01, released on Jan. 31, 1991, for use in IBM® PC personal computers. A manual is included with the "Neural Computing" package, and the teachings thereof are incorporated herein by reference to the extent they do not conflict with teachings hereof. However, the particular microprocessor 5 and neural network 7 for use with the present invention are not meant to be limited to the aforesaid, and other microprocessors 5 and neural network simulation packages 7 may be used in place of the previously mentioned computer and neural network simulation package 7 or dedicated neural network chip 7.

In this example, as shown in FIG. 2, an IR reflow oven 1 is configured with ten temperature zones Zn01 through Zn10, respectively. Each zone includes one or more infrared heaters 12, in this example. Also in this example, included in the oven 1 is a conveyor belt 14 driven by drive wheels 16, for moving a printed circuit board (PCB) 18 through the various zones Zn01–Zn10 of the oven at a predetermined speed, travelling from zone Zn01 through to zone Zn10, in this example. Also in this illustration, the PCB 18 is shown to be carrying a mole temperature measuring and logging device 20. The mole temperature measuring device 20, in this example, is provided by a "M.O.L.E. Profiler, Multi-Channel Occurrent Logger Evaluator", manufactured by Electronic Controls Design, Mulino, Oreg. 97042. The teachings of the "M.O.L.E. Operations Manual", dated Nov. 4, 1987, published by Electronic Controls Design, consisting of pages 1 through 25, is incorporated herein by reference, to the extent they do not conflict with the teachings hereof. However, other mole type loggers may be used in the present invention.

Figure 3:
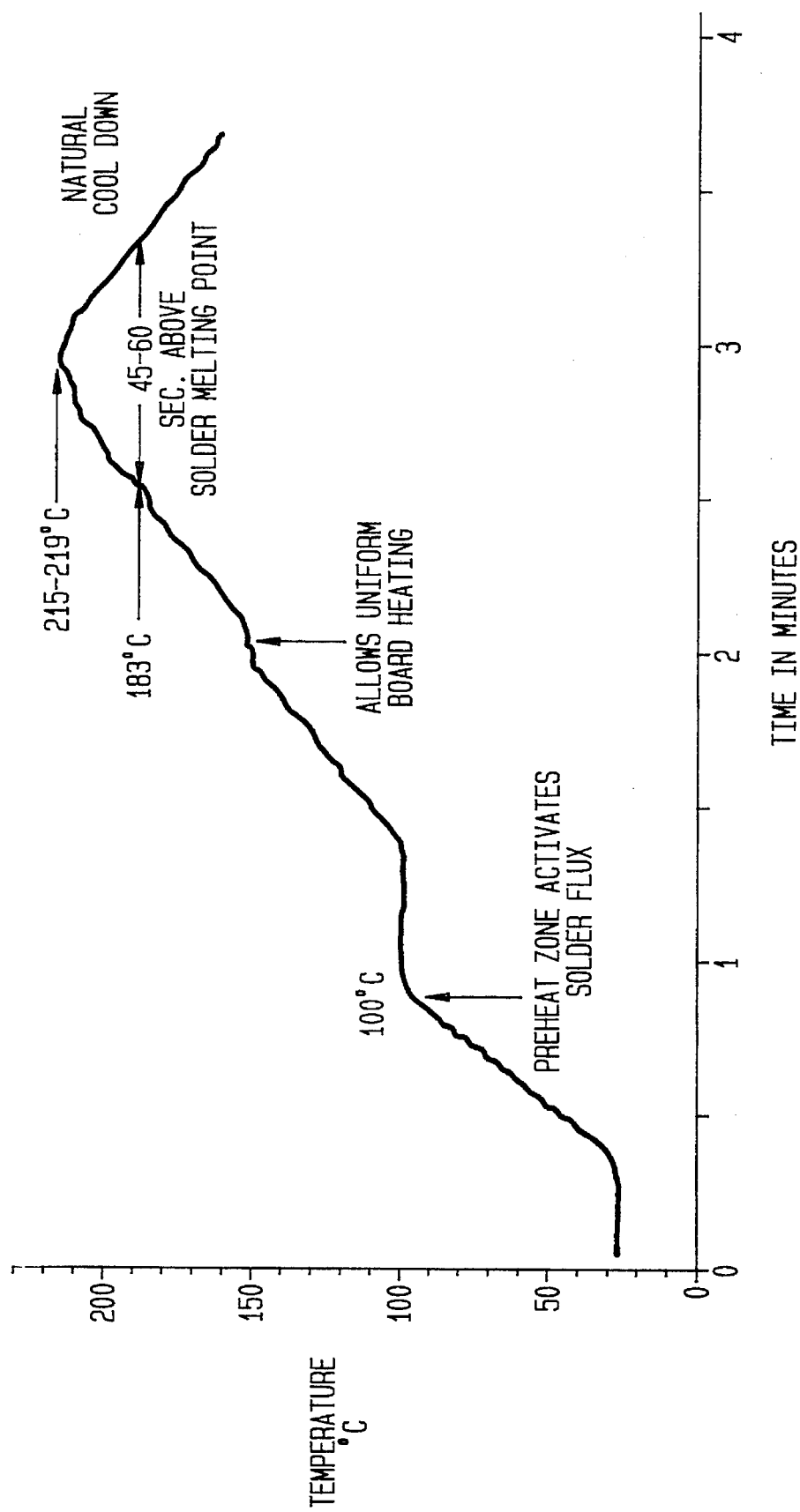
FIG. 3 shows a typical IR reflow solder profile for soldering a printed circuit board in an IR reflow oven controlled to provide the temperature profile shown.

A typical cycle of operation for reflow soldering a printed circuit board (PCB) 18 is shown in FIG. 3. The PCB 18 travels along conveyor 14 in the direction 22, as shown in FIG. 2. Typically the speed of the conveyor 14 is held constant at some predetermined speed. The PCB 18 first enters zone Zn01, and progresses sequentially through Successive zones, in this example, zones Zn02 through Zn10, respectively. Note that the zones Zn01 through Zn10 can be combined with adjacent zones for extending a particular heating of the board, through control of the heating elements 12. A typical infrared (IR) reflow solder profile or temperature profile is shown in FIG. 3. As shown, for about the first one-half minute of travel the PCB 18 is at room temperature, and for the next one-half minute of travel it is rapidly preheated to 100° C. for activating solder flux previously applied to the PCB 18 in areas to be reflow soldered. For the next approximately one-half minute of travel, PCB 18 continues to be preheated at 100° C. At time 1.5 minutes of travel, for the next one-half minute, PCB 18 is further heated in a ramp type manner to about 150° C., in a manner insuring uniform heating thereof. PCB 18 continues to be heated to increasingly higher temperatures in a linear-like manner, for obtaining at 2.5 minutes of travel a temperature of about 183° C., for causing the solder to begin melting, in this example. Between about 2.5 minutes and 3.0 minutes of travel, the temperature is linearly increased to about 215° C. to 219° C., for insuring complete reflow soldering of PCB 18. After 3.0 minutes of travel, the temperature is decreased linearly, as shown, for permitting PCB 18 to cool down in a natural manner toward room temperature. As shown, between about 2.5 minutes and 3.5 minutes of travel, the temperature of the board is held above the solder melting point of 183° C., in this example, for about 45 to 60 seconds. The IR reflow solder profile shown in FIG. 3 is for purposes of illustration only and many other IR reflow solder profiles may be applicable, depending upon the PCB 18 configuration and physical characteristics, the melting point of the particular solder used, the nature of the solder fluxes used, and so forth.

Figure 4:
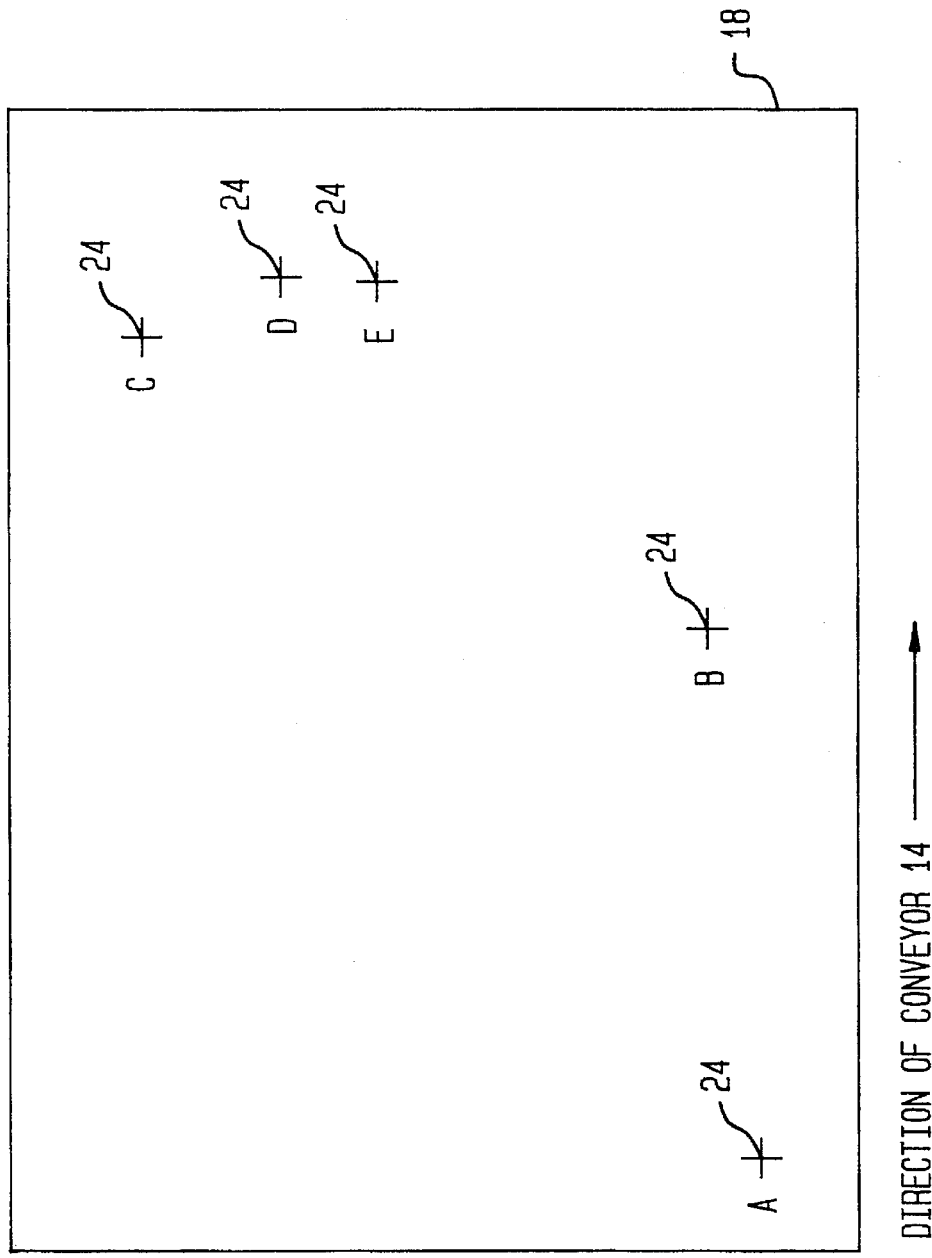
FIG. 4 shows the location of thermocouples on a PCB typically used to obtain the temperature profile for a PCB as it is passed through an IR reflow oven, in this example.
Figures 5, 6:
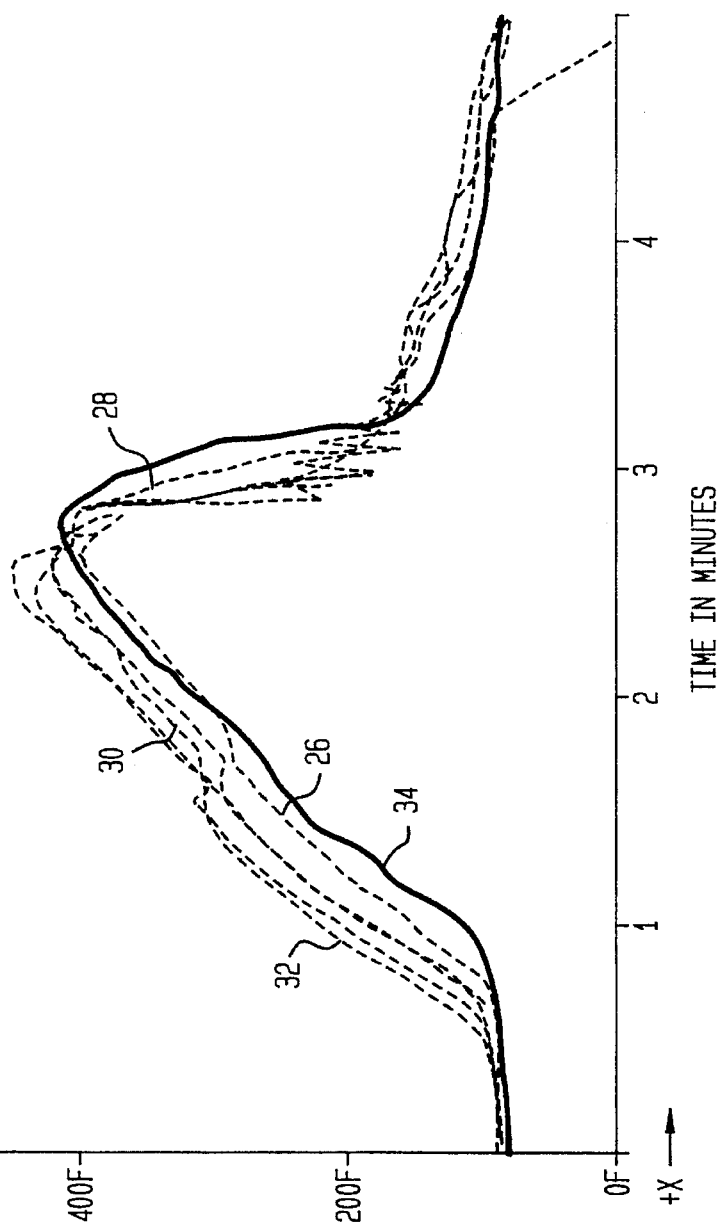
FIG. 5 shows typical temperature profiles obtained using a mole type temperature logger in association with various embodiments of the present invention.
FIG. 6 shows an IR test oven setup for obtaining reference temperatures for a new PCB, for application as input features to train an artificial neural network in one embodiment of the invention.

As is known in the art, different PCB 18 configurations have different temperature profiles, which can be considered a fingerprint or identification for the particular PCB 18 configuration, permitting it to be distinguished from other different PCB 18 configurations. In this example, the mole 20 is mounted upon a PCB 18, and the PCB 18 is run through oven 1, as shown in FIG. 2, for obtaining the temperature profile of the particular PCB 18. Temperature transducers are mounted on the PCB 18 at positions A, B, C, D, and E, respectively, as shown in FIG. 4, for example. The thermocouples or temperature sensors 24 are electrically connected to mole 20, for permitting mole 20 to record temperature profile information as PCB 18 travels through oven 1 on conveyor 14. As shown in FIG. 5, typical temperature profile curves 26, 28, 30, 32, and 34 may be logged by mole 20 for locations A, B, C, D, and E, respectively, on PCB 18, in this example. As will be shown in greater detail below, these individual temperature profile curves are used to provide data which in combination with other physical characteristics of the PCB 18 provide a fingerprint or identification for each different PCB 18 configuration. It is important that locations A through E of thermocouples 24 that were used for obtaining the original temperature profile data be the same as the placement used for obtaining the test oven 1 reference data for each specific PCB 18 configuration. FIG. 4 shows typical locations on a PCB 18 of thermocouples 24. It is also important that the test oven 1, in this example, be setup identically for each temperature profile measurement of a PCB 18 configuration, for identification purposes. In this example, oven 1 was set up as shown in FIG. 6. As shown, conveyor 14 is maintained at a speed of 75 centimeters per minute, and zones Zn01 through Zn08 have their respective heaters 12 energized at the wattage levels shown. In this example, heater 12 of zones Zn09 and Zn10 are not used. The suggested test oven 1 setup is not meant to be limiting, and many other test oven 1 setups may be used for purposes of obtaining temperature profile information for distinguishing between different PCB 18 configurations.

Note that in FIGS. 3 and 5, as indicated, the abscissa of the temperature profile curve shown has a time scale in minutes, in this example. Accordingly, from FIG. 3, it is assumed that the PCB 18 is conveyed via conveyor 14 through zones Zn01 through Zn10 in about 4.0 minutes, and in FIG. 5 in about 5.0 minutes. Depending upon the application, many other conveyor 14 speeds may be used, and the temperatures set differently for the various zones, which would result in substantially different temperature profiles.

The present inventor recognized that for optimizing the performance of neural network 7 in processing features of a particular PCB 18 for obtaining appropriate settings for oven 1, for reflow soldering the PCB 18, it is important to establish a sufficient number of features and carefully choose such features, for insuring high quality reflow soldering of the associated PCB 18.

Figure 7:
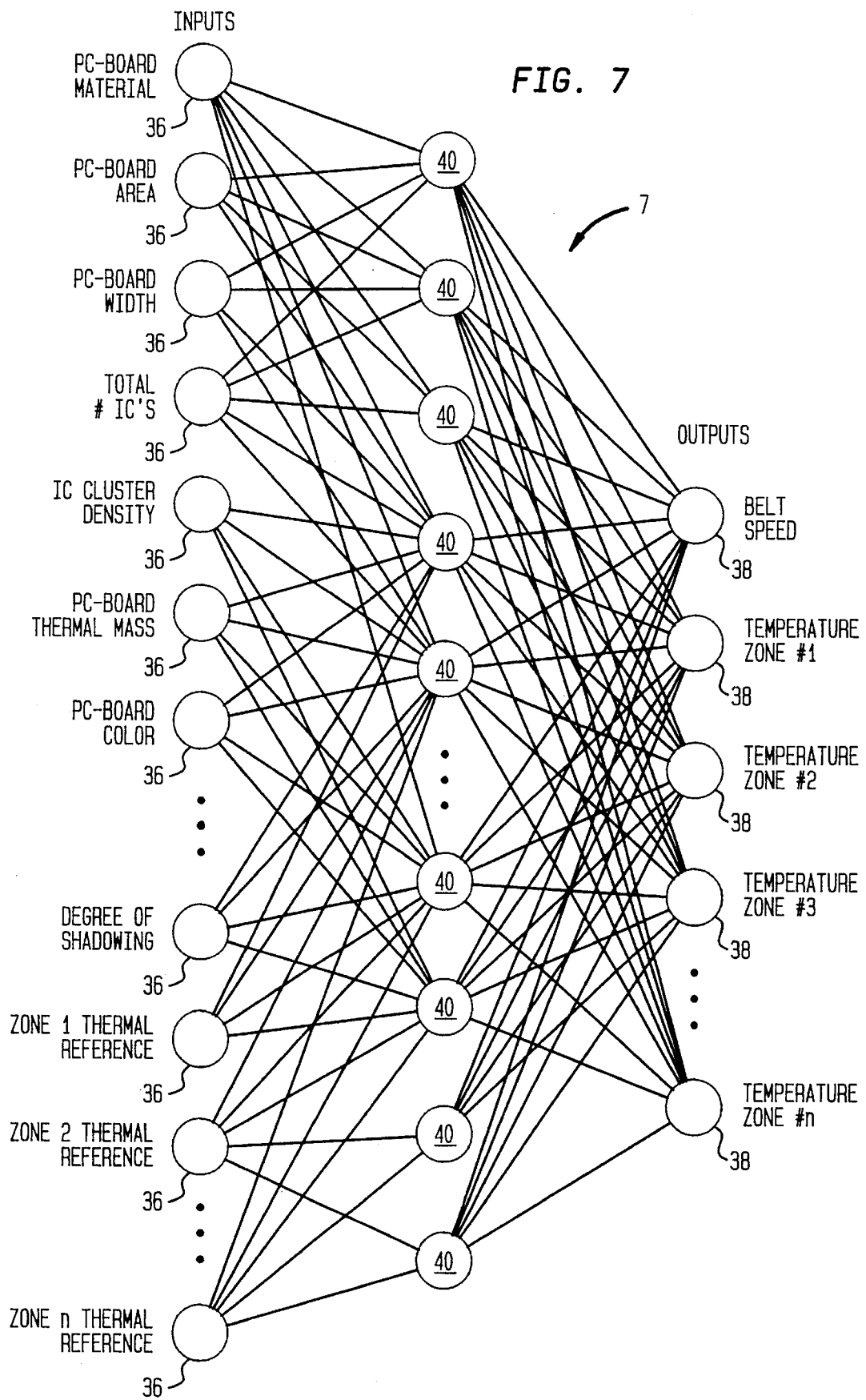
FIG. 7 shows a simplified pictorial diagram of an artificial neural network of one embodiment of the invention.

In FIG. 7, a simplified diagram of a neural network 7 is shown to include a layer comprising a plurality of input nodes 36, a second layer of nodes providing a plurality of output nodes 38, and a hidden layer of a plurality of nodes 40. As previously indicated, neural network 7 is programmed into microprocessor 5, in this example. For purposes of training neural network 7, the present inventor discovered after substantial experimentation that the IR reflow oven feature list entries shown in FIG. 8 provided optimal training of neural network 7. Such training thereafter permits neural network 7 to accept input features of a new PCB 18, and produce output settings for oven 1 for reflow soldering the new PCB 18. As shown in this example, the input features are identified as In#1 through In#23, and associated output features OUT#1 through OUT#11, respectively. Further reference is made to FIG. 8, in which the listing shown identifies and gives an explanation of each one of these features. In FIG. 9, the actual values for a representative one of a sample or representative group of different PCB boards 18 of a related family is shown. Note that the sample of values shown are for purposes of illustration only, and are not meant to be limiting.

Operation of the invention will now be described. First, one must assemble samples of various PCB boards 18 that are representative of a family of PCB boards 18 expected to be reflow soldered through oven 1. Next, for purposes of identifying each type of board as to input features, in this example the oven 1 is set up as shown in the chart of FIG. 6, as previously explained. With oven 1 set up as indicated, a mole 20 is mounted upon each one of the PCB boards 18, along with associated temperature sensors 24, as previously described, respectively, and each is run through oven 1 for obtaining the IR oven temperature profile for each representative PCB 18. The temperature profile is used to calculate input features In#16 through In#23. Note that for input features In#16 through In#19, as shown in FIG. 8, "x" is indicative of the travel time in seconds of the PCB 18 on conveyor 14 in traveling through oven 1. The output features Out#1 through Out#11, are obtained by running a plurality of each one of the representative sample of PCB 18 through oven 1, for a different combination of settings of the wattage to heaters 12 in zones Zn#01 through Zn#10, respectively, at a predetermined belt speed, for determining which combination provides the optimal reflow soldering for the particular sample PCB 18 board configuration, as previously described. Note also that the mole 20 was used on a particular PCB 18 board of the representative sample set of PCB boards 18 for making about ten runs through oven 1 for each particular configuration of PCB 18. From these ten temperature runs, the preferred temperature profile for each particular PCB 18 board was obtained.

After establishing the features for each one of the PC board 18 samples of the representative set, the features list 9 (see FIGS. 1 and 8) is used for training neural network 7. In this example, training of neural network 7 is carried out using a backpropagation neural network 7. For each representative PCB 18, neural network 7 is trained by applying the input features of FIG. 8 into microprocessor 5, for in turn applying the input features In#1 through In#23 to individual input nodes 36, respectively, and associated output settings Out#1 through Out#10 to designated output nodes 38. The latter are the desired outputs associated with the designated inputs, for optimally setting the oven 1 to reflow solder the particular PCB 18 associated therewith. The neural network simulation program 7, in the learn mode, generates outputs from the given inputs, compares these outputs with the desired outputs supplied to the output nodes, for developing error signals. The network then uses the error signals to adjust various weighting factors within the program for neural network 7 for changing the actual outputs to be as close as possible to the desired outputs Out#1 through Out#11, respectively. In other words, the programming for neural network 7 is such to reduce the error signals to a predetermined minimum value. The features list 9 for each one of the sample PCB boards 18 of the representative set of boards is applied to neural network 7 for training the network 7. During the training process, the features list 9 for the various boards are applied randomly to neural network 7 to insure that the network 7 does not learn parameters for only one PC board 18, or only for a few representative PCB boards 18. Training of neural network 7 is enhanced as the number of different samples is increased, thereby providing a more accurate representation of the universe or family of PCB boards 18. Also, it is important to terminate training when the error between actual outputs and desired outputs reaches a predetermined minimum value.

Note that for the features shown in FIG. 8 for a given sample PCB 18, the actual values must be normalized to a standard range of typically 0–1, or −1 to +1, before being processed by the neural network. The present neural network 7 as identified above using the software of NeuralWare, Inc., automatically provides for such normalizing.

Various methods are used for determining the number of training examples for adequately training a neural network. For the type of neural network 7 used in this example, the number of training examples is partly based on the number of weights in the neural network 7. The weights are the units or portions of the network trained to learn the input to output "mapping", and as such provide an estimate of the number of required training examples, and number of representative sample PCB boards 18, required in this example. For the present example, from the IR reflow oven 1 feature list 9 entries of FIG. 8, the number of training samples required can be calculated, as discussed in an article by Casimir C. "Casey" Kllmasauskas, entitled "Applying Neural Networks, Part III: Training a Neural Network", *PC AI,* May/June 1991, pages 20–24. The teachings of this article are incorporated herein by reference, to the extent they do not conflict with the teachings hereof. More specifically, from the feature list entries of FIG. 8, following the example of the article, one would obtain 23 input node weights plus one bias weight; 15 hidden unit weights, plus one bias weight; and 11 output node weights. From this, one would then perform the calculation of $[(23+1)*15+(15+1)*11]=536$. Applying the suggested multiple of 5 guideline, one would require 2,680 sample PCB boards 18 for training neural network 7. Depending upon the application, one may be able to reduce the number of sample PCB boards 18 required, yet still be able to have an acceptable set of output values when the trained neural network 7 is used in recall mode on a new PCB 18. Once neural network 7 is trained, it must be thoroughly tested by using sample PCB boards 18 not used to train the network 7, to insure that the outputs being generated on recall for new examples are within acceptable limits of error for the particular application.

The features shown in FIG. 8 were determined by the present inventor for optimizing the invention. However, in certain applications, the number of features required may be less than those shown in FIG. 8. For any particular application, one must run tests or experiment in order to determine whether the features can be reduced.

In this example, neural network 7, as provided by the "Neural Computing" software indicated above, was trained using the most simplified processing associated therewith. As indicated in the manual for the software used, other much more complicated training techniques than the straight Delta rule used in this example, can be considered for use in training network 7.

During the training of neural network 7, printer 2 and display 4 may be used in order to follow the training session. Also, after the neural network 7 is trained, for a new PCB 18, for which settings for reflow soldering thereof are obtained by applying the features list 9 for new PCB 18 to neural network 7, via microprocessor 5, as previously described. The output parameters from neural network 7 for the setting of oven 1 may be printed out on printer 2, and/or displayed on display 4, and also provided to a oven controller 3. Oven controller 3 will then respond by setting up oven 1 for optimum reflow soldering of the new PCB 18. In this manner, automated control of the oven 1 is obtained. However, in certain applications, the oven controller 3 may not be used, and the oven 1 would be manually set up by using the output settings obtained from printer 2, or displayed on display 4.

Although various embodiments of the invention have been shown and described herein, they are not meant to be limiting. Those of skill in the art may recognize various modifications to one or more of the described embodiments, which modifications are meant to be covered by the spirit and scope of the appended claims. For example, the present invention may be applicable for broader use than just IR reflow soldering, such as use with wave soldering equipment, vapor phase soldering equipment, and so forth.

What is claimed is:

1. An artificial intelligence system for processing feature data associated with individual printed circuit boards (PCB) within a family of printed circuit boards having similar but not identical combinations of characteristics, for producing as output data settings for a reflow oven for soldering one of said PCB's, said system comprising:

a neural network; and means for training said neural network to receive identifying features of each individual PCB of said family of PCB's, and produce as outputs belt speed and temperature zone settings for said reflow oven, for obtaining acceptable soldering for a selected individual PCB.

2. The system of claim 1, wherein said means for training said neural network, includes:

means for establishing predetermined temperatures for each one of a plurality of temperature zones in said reflow oven;

means for individually conveying each one of a representative set of differently configured sample PCB's from said family of PCB's through said reflow oven at a predetermined substantially constant speed; and temperature measuring means for obtaining thermal characteristics for each one of said sample PCB's, which thermal characteristics are selected and used in combination with identifiable physical characteristics for each said sample PCB, thereby providing identifying and distinguishing input features between each said sample PCB, whereby these input features are applied to input nodes of said neural network, in combination with output features of predetermined oven settings and conveyor belt speed for obtaining acceptable soldering of the associated said sample PCB applied to output nodes of said neural network, for training said neural network, said input and output features for each one of said sample PCB's being applied in a random manner to said neural network.

3. A system for automatically determining settings for a reflow oven for soldering a printed circuit board (PCB) comprising:

a microprocessor;

programming means for installing a neural network program into said microprocessor;

a reflow oven including a plurality of temperature zones, and a motor driven conveyor belt for moving a PCB through said plurality of temperature zones;

means for determining thermal characteristics for a representative plurality of different samples of printed circuit boards typical of a family of printed circuit boards that may be run through said reflow oven, whereby for each sample PCB, certain thermal characteristics are selected and used in combination with identifiable physical characteristics for each sample PCB, for obtaining identifying and distinguishing input features between each sample PCB;

means for determining for each of said plurality of sample PCB boards output features including the belt speed, and temperature settings for said temperature zones, respectively, of said oven for obtaining acceptable soldering of said sample PCB boards; and means for training said neural network by sequentially and iteratively applying via said microprocessor said input features to input nodes of said neural network, and said output features to output nodes of said neural network, respectively for each sample PCB, whereafter said neural network is operable in a recall mode for receiving features of a non-sample PCB, for providing as outputs from said neural network a desired belt speed, and temperature settings for each zone of said oven, for setting up said oven to solder said non-sample PCB.

4. The system of claim 3 further including:

output means driven by said microprocessor for providing a visual indication of data applied to said neural network, and resulting output data from said neural network.

5. The system of claim 3, further including:

oven controller means for receiving output data of said neural network from said microprocessor, for automatically setting up said reflow oven for soldering said non-sample PCB.

6. A controllable oven for soldering a printed circuit board, comprising:

artificial neural network means coupled to said oven and being trained to recognize inputted thermal and physical characteristics of a printed circuit board; and means for causing said artificial neural network means to provide settings including those for a plurality of temperature zones for said oven for obtaining acceptable soldering of said printed circuit board.

* * * * *